(12) United States Patent
Nakao

(10) Patent No.: US 7,121,286 B2
(45) Date of Patent: Oct. 17, 2006

(54) METHOD FOR CLEANING A MANUFACTURING APPARATUS AND A MANUFACTURING APPARATUS

(75) Inventor: Takashi Nakao, Danbury, CT (US)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 10/742,999

(22) Filed: Dec. 23, 2003

(65) Prior Publication Data

US 2004/0182423 A1   Sep. 23, 2004

(30) Foreign Application Priority Data

Mar. 7, 2003  (JP) .......................... P2003-062172

(51) Int. Cl.
*B08B 9/027* (2006.01)

(52) U.S. Cl. ............... 134/22.18; 134/22.1; 134/22.19; 134/34; 134/902; 438/905

(58) Field of Classification Search ............ 134/1, 134/1.1, 21, 22.1, 22.18, 26, 30, 34, 36, 902, 134/22.19; 438/905
See application file for complete search history.

(56) References Cited

U.S. PATENT DOCUMENTS 5,129,958 A * 7/1992 Nagashima et al. ....... 134/22.1
5,843,838 A * 12/1998 Saile et al. ................. 438/632
6,540,509 B1 * 4/2003 Asano et al. ............... 432/205
6,874,511 B1 * 4/2005 Kutsch et al. ............. 134/22.1
2001/0055738 A1 * 12/2001 Takahashi et al. ............ 432/2

FOREIGN PATENT DOCUMENTS

| JP | 63-260123 | 10/1988 |
| JP | 2-190472 | 7/1990 |
| JP | 7-142398 | 6/1995 |
| JP | 7-100865 | 11/1995 |
| JP | 9-148254 | 6/1997 |
| JP | 09-186149 | * 7/1997 |
| JP | 10-321610 | 12/1998 |
| JP | 11-040502 | 2/1999 |
| JP | 2002-275632 | 9/2002 |

* cited by examiner

*Primary Examiner*—M. Kornakov
(74) *Attorney, Agent, or Firm*—Finnegan, Henderson, Farabow, Garrett & Dunner, L.L.P.

(57) ABSTRACT

A method for cleaning a manufacturing apparatus, includes introducing a cleaning gas including fluorine so as to flow from upstream toward an outlet port in a reaction chamber; and flowing a protective gas which reacts with the fluorine from a vicinity of the outlet port of the reaction chamber as an introduction position.

13 Claims, 3 Drawing Sheets

METHOD FOR CLEANING A MANUFACTURING APPARATUS AND A MANUFACTURING APPARATUS

CROSS REFERENCE TO RELATED APPLICATIONS

This application is based upon and claims the benefit of priority from prior Japanese Patent Application P2003-062172 filed on Mar. 7, 2003; the entire contents of which are incorporated by reference herein.

BACKGROUND OF THE INVENTION

1. Field of the Invention

The present invention relates to a method for cleaning a semiconductor manufacturing apparatus, and more particularly, to prevention of corrosion during cleaning and residual gas after cleaning.

2. Description of the Related Art

In a cleaning method of a large-scaled reaction chamber used for a semiconductor manufacturing apparatus such as a batch-type low pressure chemical vapor deposition (LPCVD) apparatus, an etching method wherein a thermal reaction of a reactive gas such as chlorine trifluoride ($ClF_3$) or nitrogen trifluoride ($NF_3$) is used. A $ClF_3$ gas and an $NF_3$ gas, which are used in the cleaning, are very expensive. Moreover, a perfluoro compound (PFC) gas such as $NF_3$ has serious effects on the environment, including global warming and the like. From the viewpoint of gas cost reduction and PFC reduction, a fluorine ($F_2$) gas and a mixed gas including the $F_2$ gas, are considered as alternatives (refer to Japanese Patent Laid-Open No. 2002-100618 (pp 5–9, FIG. 1)).

However, the $F_2$ gas has extremely high reactivity and causes an inner wall surface of stainless steel to corrode and deteriorate due to a fluorination reaction. The stainless steel is used as a material for piping components such as conduits and valves provided at an outlet side of a reaction chamber. Moreover, the $F_2$ gas reacts with water ($H_2O$), which is adsorbed in inner walls of the reaction chamber and the conduits, to generate a hydrogen fluoride (HF) gas. Metal fluorides such as iron fluoride ($FeF_2$) and chromium fluoride ($CrF_2$) which are generated on the inner wall surface of the outlet-side piping component due to the fluorination reaction, store the hydrogen fluoride (HF) gas by coordinate bond. The HF gas stored on the inner wall surface of the outlet-side piping component is released during an LPCVD step, and back diffusion of the HF gas into the reaction chamber occurs. Thus fluorine contamination results in an interface between a semiconductor substrate and a deposited film or in the deposited film. In order to suppress the fluorine contamination, it is effective to cool the outlet-side piping component. By maintaining the inner wall surface of the outlet-side piping component at a low temperature, the corrosion of the stainless steel due to the fluorination reaction with the $F_2$ gas is suppressed. However, when a silicon (Si) film and a silicon nitride ($Si_3N_4$) film deposited inside the reaction chamber are cleaned off by the $F_2$ gas, a silicon tetrafluoride ($SiF_4$) gas is generated as a reaction product. The $SiF_4$ gas reacts with the HF gas to generate hexafluorosilicic acid ($H_2SiF_6$) which has a low vapor pressure. The low vapor pressure $H_2SiF_6$ is easily adsorbed into the cooled inner wall of the outlet-side piping component, thus becoming a fluorine contamination source.

For protection of the inner wall surface of the outlet-side piping component, corrosion-resistant surface coating is effective, such as alumina coating, nickel plating, polytetrafluoroethylene coating and the like. The stainless steel of the inner wall subjected to the surface coating can suppress the fluorination reaction even when heated. However, to apply the surface coating to everything, right down to a small sealing member on the outlet-side piping components, leads to an increase in costs. Thus, the versatility of the outlet-side piping component is limited. Moreover, some of the outlet-side piping components include a movable part such as bellows of a valve. Thus, damage caused by abrasion is unpreventable. Because of regular recoating, disassembly maintenance is required. As a result, the inoperative period of the semiconductor manufacturing apparatus is increased and thus the production capacity thereof is lowered.

SUMMARY OF THE INVENTION

A first aspect of the present invention inheres in a method for cleaning a manufacturing apparatus including introducing a cleaning gas including fluorine so as to flow from upstream toward an outlet port in a reaction chamber, and flowing a protective gas which reacts with the fluorine from a vicinity of the outlet port of the reaction chamber as an introduction position.

A second aspect of the present invention inheres in a manufacturing apparatus including a reaction chamber configured to allow a source gas to flow therein and to perform a process, a cleaning gas conduit configured to introduce a cleaning gas into a part where reaction of the process occurs in the reaction chamber, and a protective gas conduit having an introduction end configured to introduce a protective gas into a vicinity of an outlet port of the reaction chamber, the outlet port for exhausting the cleaning gas in the reaction chamber.

DETAILED DESCRIPTION OF THE INVENTION

Figure 1:
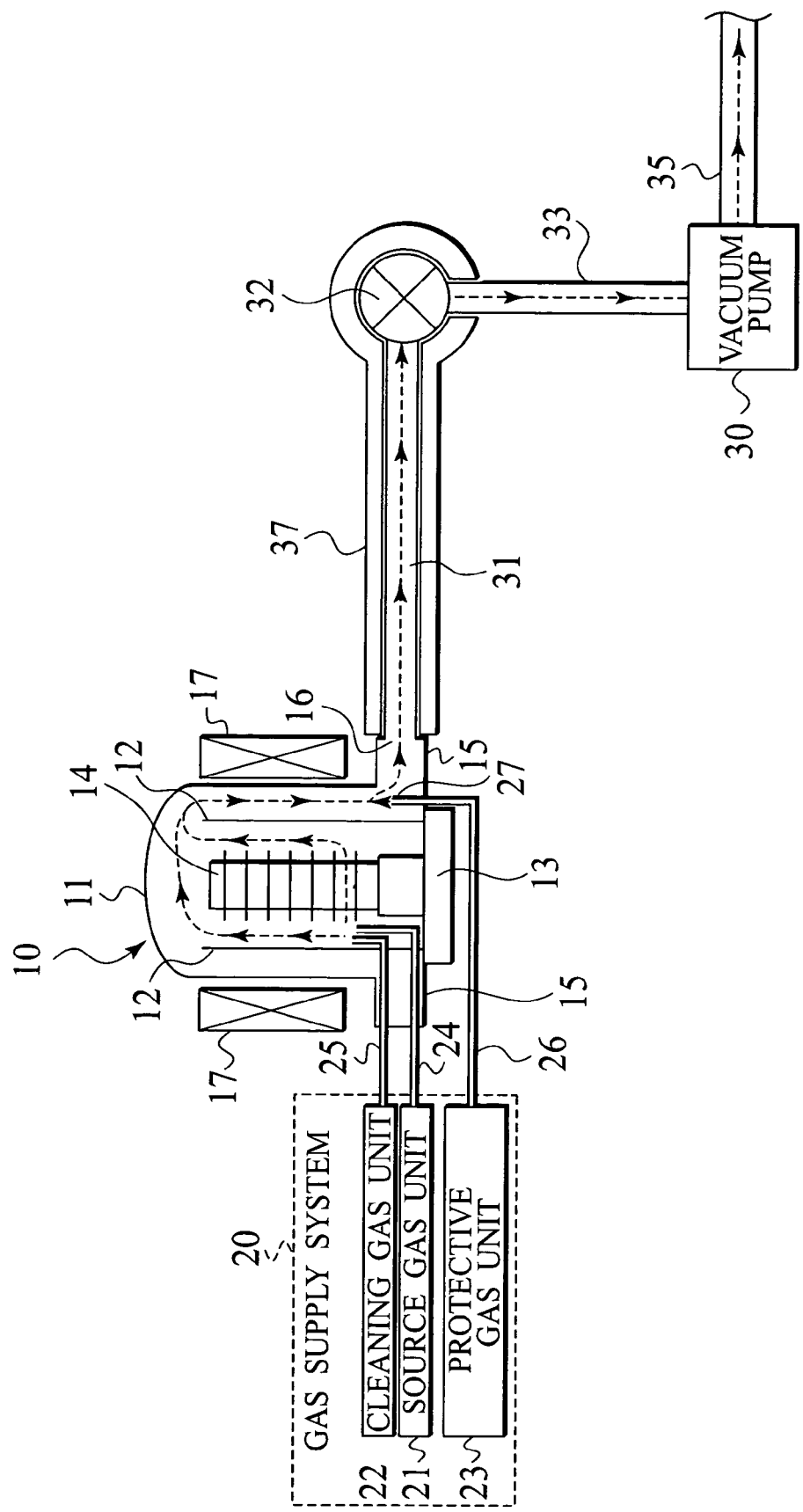
FIG. 1 is a schematic view showing an example of a semiconductor manufacturing apparatus according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

As shown in FIG. 1, an LPCVD apparatus as a semiconductor manufacturing apparatus according to a first embodiment of the present invention includes: a reaction chamber 10 which performs deposition; a gas supply system 20 which controls reactive gases supplied to the reaction chamber 10; and a vacuum pump 30 which evacuates the reaction chamber 10.

The reaction chamber 10 has a quartz outer tube 11 and a quartz inner tube 12. Inside the inner tube 12, a quartz pedestal 14 loading a semiconductor substrate thereon, is provided on a base plate 13. Between the outer tube 11 and the base plate 13, a stainless steel manifold 15 is provided. A plurality of gas conduits 24, 25 and 26 for introducing the reactive gas are connected to the manifold 15. Moreover, an outlet port 16 for evacuation is provided in the manifold 15. Outside the outer tube 11, a heating furnace 17 is disposed, which controls a temperature of the semiconductor substrate loaded on the pedestal 14. The reaction chamber 10 has a leak-tight structure capable of shutting out the outside air and maintaining an atmosphere therein.

The gas supply system 20 includes a source gas unit 21, a cleaning gas unit 22 and a protective gas unit 23. A source gas conduit 24 and a cleaning gas conduit 25 are connected to the source gas unit 21 and the cleaning gas unit 22, respectively. The source and cleaning gas conduits 24, 25 are provided through the manifold 15 so as to introduce a source gas for deposition and a cleaning gas for reaction chamber cleaning, respectively, from the lower part inside the inner tube 12. To the protective gas unit 23, the protective gas conduit 26 having an introduction end 27 is connected. The protective gas conduit 26 is provided through the manifold 15 so as to introduce a protective gas for suppressing corrosion caused by the cleaning gas to the vicinity of the outlet port 16 from the introduction end 27 between the outer tube 11 and the inner tube 12.

In order to evacuate the inside of the reaction chamber 10 by use of the vacuum pump 30, an outlet conduit 31 is connected to the outlet port 16 of the reaction chamber 10. To the exhaust side of the outlet conduit 31, a main valve 32 of, for example, a bellow-sealed gate valve, a bellow-sealed angle valve and the like, is connected. To the exhaust side of the main valve 32, an evacuation conduit 33 is connected. To the exhaust side of the evacuation conduit 33, the suction side of the vacuum pump 30 is connected. Furthermore, to the exhaust side of the vacuum pump 30, an exhaust conduit 35 is connected. The main valve 32 separates the reaction chamber 10 and the vacuum pump 30 from each other according to needs, and adjusts exhaust conductance. The vacuum pump 30 is used for exhausting the unreacted source gas introduced into the reaction chamber 10 and reaction products. For the outlet conduit 31 and the main valve 32, a heating unit 37 for controlling the temperature of the piping components is provided. Here, the primary material of the outlet-side piping components including the outlet conduit 31, a primary part of the main valve 32 and the like is stainless steel.

Next, description will be made regarding a cleaning method according to the first embodiment by use of the LPCVD apparatus depositing a Si film. When the Si film is deposited by use of the LPCVD apparatus, a semiconductor substrate is first loaded on the pedestal 14. The semiconductor substrate is heated to about 700° C. by the heating furnace 17 and the source gas, for example, a monosilane (SiH$_4$) gas is introduced from the source gas unit 21 through the source gas conduit 24 to the reaction chamber 10. The source gas flows from the lower side of the reaction chamber 10 toward the upper side thereof between the inner tube 12 and the pedestal 14. The source gas deposits the Si film on a surface of the heated semiconductor substrate by a pyrolysis reaction. The pyrolysis reaction is as follows.

$$SiH_4(gas) \rightarrow Si(solid) + 2H_2(gas) \qquad (1)$$

Note that the hydrogen (H$_2$) gas, which is a by-product, is exhausted by the vacuum pump.

The SiH$_4$ gas is pyrolytically decomposed not only on the semiconductor substrate surface but also on the inner wall surface of the reaction chamber 10 such as surfaces of the pedestal 14, the inner tube 12, the outer tube 11 and the like, which are heated by the heating furnace 17. Thus, an accumulated film containing Si is formed on the inner wall surface of the reaction chamber 10. When the accumulated film on the inner wall of the reaction chamber 10 increases, deposition conditions are changed. Moreover, when the thickness of the accumulated film on the inner wall of the reaction chamber 10 increases, the accumulated film is partially stripped away from the inner wall of the reaction chamber 10, thus generating dust. As a result, the manufacturing yield of the semiconductor apparatus decreases. Therefore, the cleaning process for removing the accumulated film on the inner wall of the reaction chamber 10 is regularly performed. In order to improve the efficiency of the cleaning, a gas including fluorine which is highly reactive to the Si of the accumulated film, for example, an F$_2$ gas or the like is used as the cleaning gas.

In the cleaning method according to the first embodiment, for example, the cleaning gas is introduced from the cleaning gas unit 22 of the gas supply system 20 shown in FIG. 1 into the reaction chamber 10 through the cleaning gas conduit 25. In order to improve the reaction efficiency of the cleaning gas, the inner wall of the reaction chamber 10 is heated to about 400° C. by the heating furnace 17. The introduction position of the cleaning gas is provided in the vicinity of the introduction position of the source gas. Thus, similarly to the source gas, the cleaning gas flows through the path shown by a dotted line in FIG. 1, from the lower side toward the upper side inside the reaction chamber 10 between the inner tube 12 and the pedestal 14. Then, the cleaning gas passed through the upper ends of the inner tube 12, and of the pedestal 14, flows from the upper side toward the lower side between the inner tube 12 and the outer tube 11, and is exhausted from the outlet port 16 of the reaction chamber 10. When the F$_2$ gas is used as the cleaning gas, the accumulated film on the inner wall of the reaction chamber 10 is etched by a reaction as follows.

$$Si(solid) + 2F_2(gas) \rightarrow SiF_4(gas) \qquad (2)$$

During the cleaning, a SiF$_4$ gas, which is a reaction product, and the unreacted F$_2$ gas are exhausted.

The F$_2$ gas corrodes the stainless steel, which is the primary material of the vacuum piping components. In the first embodiment, the unreacted cleaning gas flowing into the outlet port 16 during the cleaning process is allowed to react with the protective gas and then removed. For example, when a methane (CH$_4$) gas, which is an organic gas, is used as the protective gas, the methane gas reacts with the unreacted cleaning gas to generate a fluoromethane (CH$_3$F) gas and an HF gas as follows.

$$CH_4(gas) + F_2(gas) \rightarrow CH_3F(gas) + HF(gas) \qquad (3)$$

The protective gas is introduced in a direction opposite to the flow of the cleaning gas through a path between the inner tube 12 and the outlet port 16. Therefore, the unreacted cleaning gas becomes more likely to react with the protective gas when encountering the protective gas. Thus, the concentration of the unreacted cleaning gas in the exhaust gas is decreased.

The $CH_3F$ gas and the HF gas, which are generated by the reaction of the unreacted cleaning gas with the protective gas, are less reactive to stainless steel than the $F_2$ gas in the cleaning gas. Therefore, on the stainless steel inner surfaces of the manifold 15 in the vicinity of the outlet port 16 and of the outlet-side piping components including the outlet conduit 31, the main valve 32 and the like, which are connected to the downstream side of the outlet port 16, corrosion caused by the unreacted cleaning gas is suppressed.

Part of the $SiF_4$ gas generated by the reaction equation (2) reacts with the HF gas generated by the reaction equation (3) in the vicinity of the outlet port 16 to generate the low vapor pressure $H_2SiF_6$ gas. In order to prevent adsorption of the $H_2SiF_6$ gas to the inner surfaces of the outlet-side piping components, the inner surfaces of the outlet-side piping components including the outlet conduit 31 and the main valve 32, are maintained at about 150° C. by the heating unit 37 during the cleaning. Moreover, adsorption of $H_2O$ to the inner surfaces of the outlet-side piping components is suppressed by the heating, and thus, storage of the reaction products such as the HF gas and the $H_2SiF_6$ gas can be prevented.

According to the cleaning method of the first embodiment, the introduction of the protective gas during the cleaning of the reaction chamber 10 enables corrosion of the outlet-side piping components to be suppressed. Furthermore, storage of the gas including fluorine on the inner surfaces of the outlet-side piping components can be prevented.

In the first embodiment, the introduction of the protective gas is desirable before or at the same time as the introduction of the cleaning gas into the reaction chamber 10. This is because, if the introduction of the protective gas is too late, the unreacted cleaning gas may be exhausted to the outlet conduit 31.

Moreover, in the first embodiment, description has been made of using the $CH_4$ gas as the protective gas. However, similarly to the $CH_4$ gas, other organic gases such as ethane ($C_2H_6$), ethylene ($C_2H_4$), propane ($C_3H_8$) or the like also react with fluorine to generate hydrofluorocarbon (HFC). Thus, it is needless to say that the other organic gases such as those described above can be used as the protective gases. Moreover, the protective gas is not limited to organic gas but may be, for example, a carbon oxide gas, a nitrogen oxide gas, a diborane ($B_2H_6$) gas or the like. The carbon oxide gas or the nitrogen oxide gas also reacts with the cleaning gas containing fluorine to generate a less reactive fluoride. For example, in the case of carbon monoxide (CO), the CO gas reacts with the $F_2$ gas to generate carbonyl fluoride ($COF_2$) as follows.

$$CO(gas) + F_2(gas) \rightarrow COF_2(gas) \quad (4)$$

Moreover, the introduction end 27 of the protective gas conduit 26 for the protective gas is adjusted to a height such that etching of the inner wall of the reaction chamber 10 by use of the cleaning gas is not inhibited by the reverse flow of the protective gas. For example, the introduction end 27 is placed at a position which is lower than the interface between the manifold 15 and the outer tube 11 and is higher than the center of diameter direction of the outlet conduit 31 as shown in FIG. 1. Moreover, as described above, the introduction end 27 is placed upward so as to be opposite to the direction of the unreacted cleaning gas flowing from the upper side of the reaction chamber 10 toward the lower side thereof between the inner tube 12 and the outer tube 11.

Figure 2:
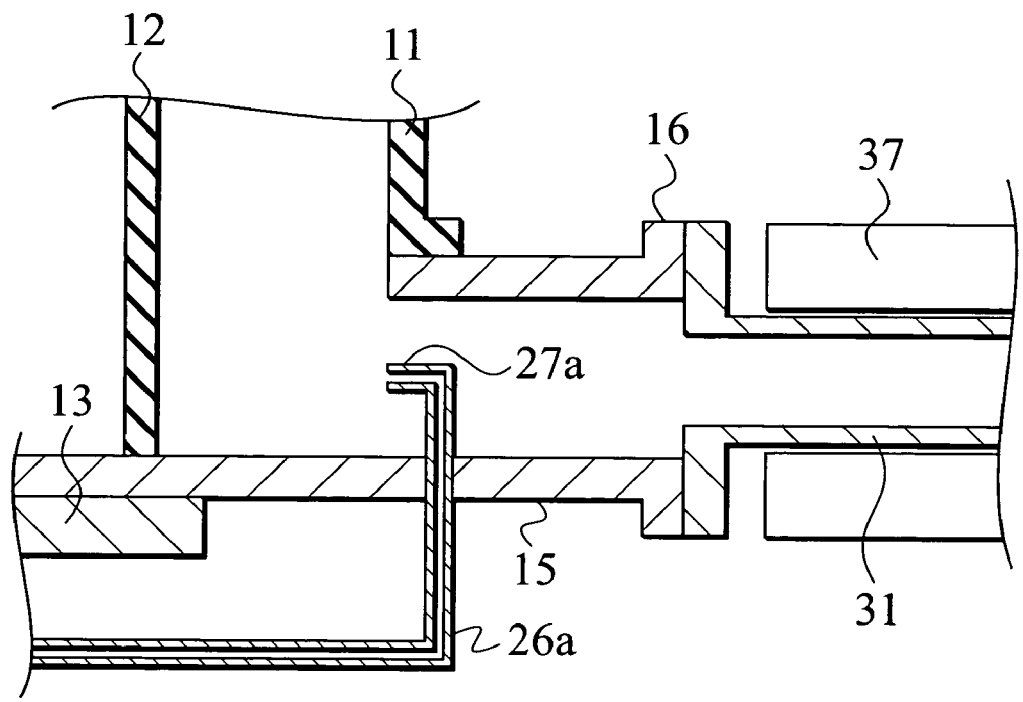
FIG. 2 is a schematic view showing another example of the semiconductor manufacturing apparatus according to the first embodiment of the present invention.

In the first embodiment, the installation position of the introduction end 27 of the protective gas conduit 26 for the protective gas is not limited to the foregoing position. For example, as shown in FIG. 2, a protective gas conduit 26a for the protective gas, which has an introduction end 27a, is placed in the vicinity of the outlet port 16 of the manifold 15. At the installation position of the introduction end 27a, the flow of the cleaning gas is changed from the direction from the upper side of the reaction chamber toward the lower side thereof, to a direction from the manifold 15 toward the outlet conduit 31. Moreover, the introduction end 27a of the protective gas conduit 26a is bent about at a right angle toward the inner tube 12 at a height of the center of diameter direction of the outlet conduit 31. When the introduction end 27a is installed as shown in FIG. 2, the protective gas is introduced from the introduction end 27a while flowing in direction opposite to that of the unreacted cleaning gas flow, of which path is bent at a right angle in the manifold 15. Therefore, the protective gas reacts with the unreacted cleaning gas at the upstream side of the outlet port 16. Thus, the unreacted cleaning gas can be prevented from flowing into the outlet conduit 31 at the exhaust side of the outlet port 16.

Figure 3:
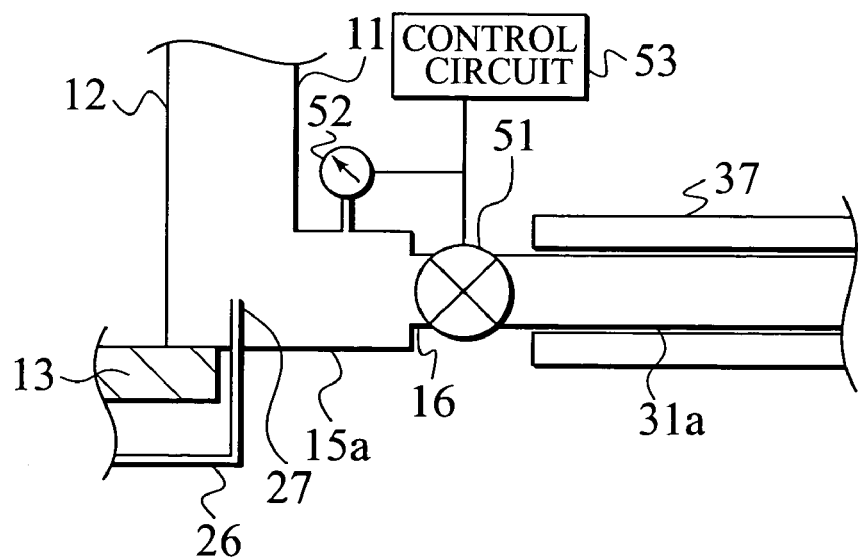
FIG. 3 is a schematic view showing an example of a semiconductor manufacturing apparatus according to a modification of the first embodiment of the present invention.

Moreover, in order to improve the reaction efficiency of the protective gas, it is effective to reduce the conductance of the outlet-side conduits and decrease the flow rate of the unreacted cleaning gas. There is also a method of reducing the conductance by controlling the valve opening of the main valve 32. However, the above method is limited in the control range of the conductance and thus is not practical. For example, as shown in FIG. 3, a variable conductance controller 51 is provided between the outlet port 16 and an outlet conduit 31a. A feedback signal is obtained from a vacuum gauge 52 provided in a manifold 15a in the vicinity of the outlet port 16 and the variable conductance controller 51 is controlled by use of a control circuit 53. During the cleaning of the reaction chamber 10, when the conductance of the variable conductance controller 51 is controlled so as to be smaller, thus decreasing the flow rate of the cleaning gas, the protective gas becomes more likely to encounter the unreacted cleaning gas. Thus, the concentration of the unreacted cleaning gas can be further reduced. Note that, in the foregoing description, the variable conductance controller 51 is automatically controlled by the control circuit 53. However, a manual variable conductance controller may be also used. Moreover, it is needless to say that, in place of the variable conductance controller, a vacuum valve such as a slot valve or a butterfly valve can be also used.

Second Embodiment

Figure 4:
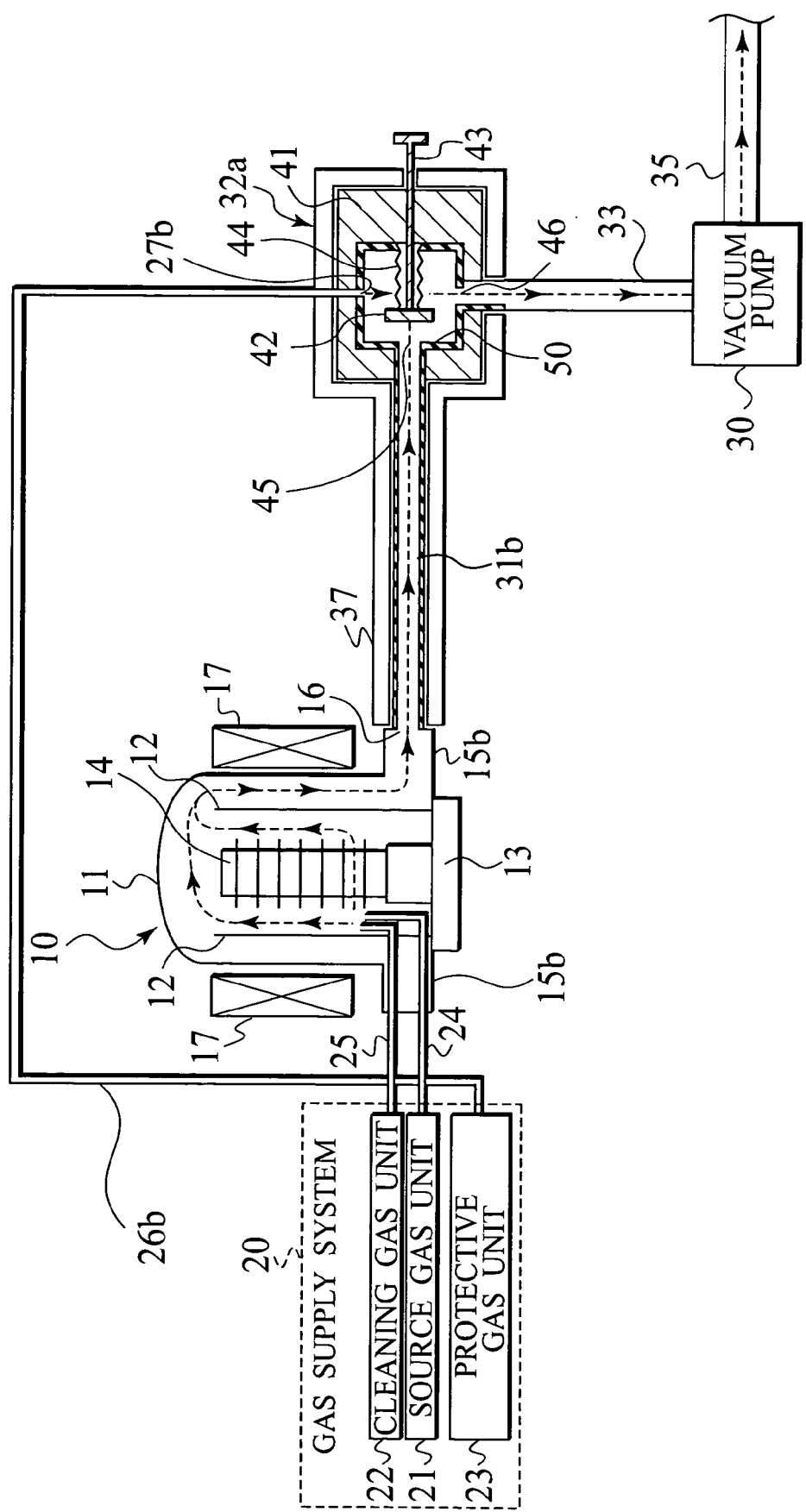
FIG. 4 is a schematic view showing an example of a semiconductor manufacturing apparatus according to a second embodiment of the present invention.

In an LPCVD apparatus as a semiconductor manufacturing apparatus according to a second embodiment of the present invention, as shown in FIG. 4, a protective gas conduit 26b for the protective gas, which has an introduction end 27b, is connected to a main valve 32a of a bellow-sealed angle valve. The gas conduits 24 and 25 for the source gas and the cleaning gas respectively are provided through a manifold 15b so as to introduce the respective gases from the lower part inside the inner tube 12 similarly to the first embodiment.

The main valve 32a includes an inlet valve port 45 and an outlet valve port 46 in a body 41. The body 41 includes: a disc 42 which performs the opening/closing operation of the valve; a stem 43 which manipulates the disc 42 from the outside of the body 41; and bellows 44 which are welded to the disc 42 and the body 41 and expand and contract in response to the manipulation of the stem 43. Note that the bellows 44 have a structure for airproofing the inside of the main valve 32a from the outside air. Therefore, the stem 43 installed outside the bellows 44 does not contact the gas exhausted from the reaction chamber 10. The inlet valve port 45 of the main valve 32a is connected to the outlet port 16 of the manifold 15b by an outlet conduit 31b. The outlet valve port 46 of the main valve 32a is connected to the vacuum pump 30 by the evacuation conduit 33.

In the second embodiment, a protective coat 50 made of an alumina material or the like covers the inner surfaces of the outlet conduit 31b and the body 41 of the main valve 32a. Therefore, even if the inner surfaces of the outlet conduit 31b and the body 41 are heated by use of the heating unit 37, corrosion caused by the $F_2$ gas will not occur. Meanwhile, on the disc 42 and the bellows 44, which are included in the main valve 32a, no protective coat is formed. This is because the disc 42 and the bellows 44 are movable parts, and it is very possible that the disc 42 and the bellows 44 may cause to generate dust by abrasion of the stripped protective coat.

The second embodiment is different from the first embodiment in that the inner surfaces of the outlet conduit 31b and the body 41 of the main valve 32a are prevented from corroding by the protective coat 50, and the protective gas is introduced into the movable parts such as the disc 42 and bellows 44 of the main valve 32a. Other points than the above are similar to those of the first embodiment and thus repetitive description will be omitted.

In a cleaning method according to the second embodiment, before introducing the cleaning gas, for example, the inner surfaces of the outlet conduit 31b and the main valve 32a are heated to about 150° C. by the heating unit 37 and the protective gas is introduced from the introduction end 27b inside the main valve 32a through the protective gas conduit 26b. The cleaning gas is introduced into the reaction chamber 10 through the cleaning gas conduit 25 and reacts with the accumulated film. Consequently, the reaction product and the unreacted cleaning gas are exhausted from the outlet port 16 of the manifold 15b. The inner surfaces of the outlet conduit 31b and the body 41 are covered with the protective coat 50 and thus are not corroded by the unreacted cleaning gas. Moreover, the inner surfaces of the outlet conduit 31b and the body 41 are heated to about 150° C. and thus, adsorption of the reaction product thereto is also suppressed. The protective gas is previously introduced inside the main valve 32a to encounter the unreacted cleaning gas and decrease the concentration of the unreacted cleaning gas. Therefore, the movable parts such as the disc 42 and the bellows 44 can be also protected from the corrosive effect of the unreacted cleaning gas.

According to the cleaning method of the second embodiment, the introduction of the protective gas during the cleaning of the reaction chamber 10 enables the corrosion of the outlet-side piping components to be suppressed. Furthermore, storage of the gas including fluorine on the inner surfaces of the outlet-side piping components can be prevented.

Other Embodiments

In the description of the foregoing first and second embodiments, the $F_2$ gas has been used as the cleaning gas. However, it is needless to say that, as the cleaning gas, not only the $F_2$ gas but also a halide gas such as an $NF_3$ gas and a $CCl_3$ gas, a mixed gas of the $F_2$ gas or the fluoride gas or the like can be used. Moreover, needless to say, diluting the $F_2$ gas, the halide gas, the mixed gas of the $F_2$ gas or the fluoride gas and the like, with an inert gas, produces a gas which may also be used as the cleaning gas.

In the description of the first and second embodiments, the LPCVD apparatus for an Si film has been described as an example. It is needless to say that a manufacturing apparatus is not limited to the LPCVD apparatus for the Si film. For example, the LPCVD apparatus may be used for depositing a $Si_3N_4$ film, a silicon oxide ($SiO_2$) film, a tungsten (W) film, a tungsten silicide (WSix) film or the like. Alternatively, the LPCVD apparatus may be an atmospheric pressure CVD apparatus. Moreover, the LPCVD apparatus may be also another semiconductor manufacturing apparatus such as an epitaxial growth apparatus or a dry etching apparatus. For the main valve 32a, a bellow-sealed angle valve has been used. However, it is needless to say that, without being limited to the bellow seal, a diaphragm seal, an O-ring seal or the like can be used. Moreover, it is also needless to say that, without being limited to an angle valve, a straight valve, a butterfly valve, a gate valve or the like can be used.

What is claimed is:

1. A method for cleaning a manufacturing apparatus, comprising:
   introducing a cleaning gas including fluorine gas so as to flow from upstream toward an outlet port in a reaction chamber simultaneously; and
   flowing a protective gas to protect against reaction of the fluorine gas with an inner wall of a piping component directly connected to a downstream side of the outlet port of the reaction chamber, from a vicinity of the outlet port of the reaction chamber as an introduction position, the protective gas reacting with an unreacted portion of the fluorine gas during flowing of the cleaning gas.

2. The method of claim 1, wherein the protective gas is an organic gas including hydrogen.

3. The method of claim 1, wherein the protective gas includes either a carbon oxide or a nitrogen oxide.

4. The method of claim 1, wherein the protective gas is selectively introduced into a manifold of the reaction chamber, as the introduction position, in the vicinity of the outlet port of the reaction chamber.

5. The method of claim 1, wherein the protective gas is selectively introduced inside a main valve, as the introduction position, the main valve being connected between the reaction chamber and a vacuum pump which evacuates the reaction chamber.

6. The method of claim 1, wherein an introduction of the protective gas is prior to or simultaneous with an introduction of the cleaning gas.

7. The method of claim 1, wherein the protective gas is introduced in a direction opposite to a flow of the cleaning gas.

8. The method of claim 2, wherein the protective gas is selectively introduced into a manifold of the reaction chamber, as the introduction position, in the vicinity of the outlet port of the reaction chamber.

9. The method of claim 8, wherein the protective gas is introduced in a direction opposite to a flow of the cleaning gas.

10. The method of claim 2, wherein an introduction of the protective gas is prior to or simultaneous with an introduction of the cleaning gas.

11. The method of claim 3, wherein the protective gas is selectively introduced into a manifold of the reaction chamber, as the introduction position, in the vicinity of the outlet port of the reaction chamber.

12. The method of claim 11, wherein the protective gas is introduced in a direction opposite to a flow of the cleaning gas.

13. The method of claim 3, wherein an introduction of the protective gas is prior to or simultaneous with an introduction of the cleaning gas.

* * * * *

UNITED STATES PATENT AND TRADEMARK OFFICE
CERTIFICATE OF CORRECTION

PATENT NO. : 7,121,286 B2  Page 1 of 1
APPLICATION NO. : 10/742999
DATED : October 17, 2006
INVENTOR(S) : Nakao It is certified that error appears in the above-identified patent and that said Letters Patent is hereby corrected as shown below:

Claim 10, column 8, line 66, delete "prior to or".

Claim 13, column 10, line 2, delete "prior to or".

Signed and Sealed this

Ninth Day of January, 2007

JON W. DUDAS
*Director of the United States Patent and Trademark Office*